(12) United States Patent
Bekku

(10) Patent No.: US 8,541,300 B2
(45) Date of Patent: Sep. 24, 2013

(54) METHOD OF MANUFACTURING SEMICONDUCTOR DEVICE, SEMICONDUCTOR DEVICE THUS MANUFACTURED, AND SEMICONDUCTOR MANUFACTURING APPARATUS

(75) Inventor: Fumihiro Bekku, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 465 days.

(21) Appl. No.: 12/801,367

(22) Filed: Jun. 4, 2010

(65) Prior Publication Data

US 2011/0018137 A1    Jan. 27, 2011

(30) Foreign Application Priority Data

Jul. 23, 2009  (JP) ................. 2009-172477

(51) Int. Cl.
*H01L 23/498*    (2006.01)

(52) U.S. Cl.
USPC ............................ 438/614; 438/645; 257/773

(58) Field of Classification Search
USPC ............................ 257/773; 438/612, 645, 614
See application file for complete search history.

(56) References Cited

U.S. PATENT DOCUMENTS

| | | | |
|---|---|---|---|
| 6,458,628 B1 * | 10/2002 | Distefano et al. | 438/126 |
| 6,956,287 B2 * | 10/2005 | Hedler et al. | 257/701 |
| 2005/0214661 A1 * | 9/2005 | Stasiak et al. | 430/22 |

FOREIGN PATENT DOCUMENTS

| | | |
|---|---|---|
| JP | 2007-48971 A | 2/2007 |
| JP | 2007-317857 A | 12/2007 |
| JP | 2008-109024 A | 5/2008 |
| JP | 2008-306146 A | 12/2008 |
| JP | 2009-49226 A | 3/2009 |

OTHER PUBLICATIONS

Chinese Office Action dated Jan. 31, 2012, with English-language translation.
Chinese Office Action dated Sep. 13, 2012, and English Translation Thereof.
Japanese Office Action dated Oct. 2, 2012, and English Translation Thereof.

* cited by examiner

*Primary Examiner* — S. V. Clark
*Assistant Examiner* — Krista Soderholm
(74) *Attorney, Agent, or Firm* — McGinn IP Law Group, PLLC

(57) ABSTRACT

A plurality of projections, respectively given later as cores of a plurality of external connection terminals, are formed first by selectively forming a curable resin layer over a protective insulating film; flat portions are then formed respectively on the top surfaces of the plurality of projections, by pressing a molding jig having a flat opposing surface onto the top surfaces of the plurality of projections, before the projections are cured; the plurality of projections are cured; and the plurality of external connection terminals, and the plurality of interconnects are formed, by selectively forming an electro-conductive film over the plurality of projections, the protective insulating film, and the plurality of electrode pads.

16 Claims, 7 Drawing Sheets

METHOD OF MANUFACTURING SEMICONDUCTOR DEVICE, SEMICONDUCTOR DEVICE THUS MANUFACTURED, AND SEMICONDUCTOR MANUFACTURING APPARATUS

This application is based on Japanese patent application No. 2009-172477 the content of which is incorporated hereinto by reference.

BACKGROUND

1. Technical Field

The present invention relates to a method of manufacturing a semiconductor device having external connection terminals which are configured resin cores and an electro-conductive film formed thereon, a semiconductor device thus manufactured, and a semiconductor manufacturing apparatus.

2. Related Art

Semiconductor device has external connection terminals such as bumps formed thereon, for the convenience of mounting the semiconductor device onto a mounting substrate. Circuits owned by the semiconductor device are connected through the external connection terminals to electrodes such as lands on the mounting substrate. For correct mounting of the semiconductor device onto the mounting substrate, the top surfaces of the external connection terminals preferably have the same level of height. More specifically, since the surfaces of the electrodes on the mounting substrate are flat, and have a uniform height (the same level of height) in a single mounting substrate, so that also the heads of the external connection terminals of the semiconductor device, to be connected to the electrodes, need be flat and aligned in the same level of height.

On the other hand, in recent years, there has been a proposal of external connection terminals configured by resin cores and an electro-conductive film formed thereon (for example, Japanese Laid-open patent publication NOs. 2009-49226 and 2007-48971). In particular, the latter publication (No. 2007-48971) describes a method of manufacturing a semiconductor device in which bumps are formed by forming an electro-conductive layer over resin projections which are later given as cores, and stamp the resin projections, while placing the electro-conductive layer in between, by a molding surface of an inspection terminal. In order to make the heads of the external connection terminals of the semiconductor device flat and aligned in the same level of height, the heads of the resin projections need be made flat and aligned in the same level of height.

SUMMARY

According to the technique described in Japanese Laid-open patent publication NO. 2007-48971, the resin projections are molded after the thermosetting resin is cured, and further after the electro-conductive layer is formed. Molding of the resin projections therefore needs a certain level of pressure. It has, therefore, been anticipated that the electro-conductive film may deform in the process of molding of the resin projections, and thereby the electro-conductive film may be ruptured or cracked to elevate the resistivity, and reliability of connection between the external connection terminals and the mounting substrate may degrade.

In one embodiment, there is provided a method of manufacturing a semiconductor device includes forming a plurality of external connection terminals over a semiconductor substrate which has a protective insulating film, a plurality of openings formed in the protective insulating film, and a plurality of electrode pads respectively exposed in the plurality of openings.

The forming a plurality of external connection terminals includes:

forming a plurality of projections respectively given later as cores of the plurality of external connection terminals, by selectively forming a curable resin layer over the protective insulating film;

forming flat portions respectively on the top surfaces of the plurality of projections, by pressing a molding jig having a flat surface onto the top surfaces, before the projections are cured;

curing the plurality of projections; and forming the plurality of external connection terminals, and the plurality of interconnects which respectively connect the plurality of external connection terminals to the electrode pads, by selectively forming an electro-conductive film over the plurality of projections, the protective insulating film, and the plurality of electrode pads.

According to the embodiment, the flat portions are formed on the top surfaces of the projections, before the resin composing the projections is cured, and also before the electro-conductive film is formed over the projection, by pressing the molding jig onto the projections. The electro-conductive film which composes the external connection terminals may therefore be prevented from rupturing, and from cracking to cause elevation of resistivity, and thereby the reliability of connection between the external connection terminals and the mounting substrate may be prevented from degrading.

In another embodiment, there is also provided a semiconductor device which includes:

a protective insulating film;

a plurality of openings formed in the protective insulating film;

a plurality of electrode pads respectively positioned at the plurality of openings;

a plurality of external connection terminals formed over the protective insulating film; and a plurality of interconnects which respectively connect the plurality of external connection terminals to the electrode pads.

The external connection terminals further respectively include:

projections composed of a resin; and an electro-conductive film formed on the projections and connected to the interconnects.

The projections of the plurality of external connection terminals respectively include flat top surfaces aligned in the same level of height.

In another embodiment, there is still also provided a semiconductor manufacturing apparatus which includes:

a stage on which a semiconductor substrate is placed;

a molding jig disposed opposing to the stage while placing the semiconductor substrate in between, and having a flat opposing surface opposed to the stage; and a moving mechanism which moves at least either of the stage and the molding jig towards the other.

Accordingly, the embodiments may suppress the electro-conductive film which composes the external connection terminals from rupturing, and from cracking to cause elevation of resistivity, and may thereby successfully suppress the reliability of connection between the external connection terminals and the mounting substrate from being degraded.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1A:
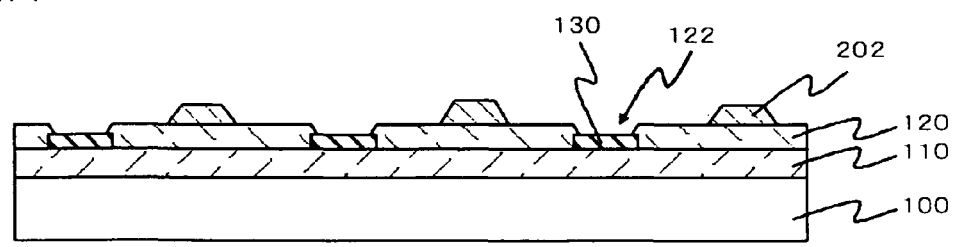
FIGS. 1A to 4 are sectional views illustrating the individual steps of a method of manufacturing a semiconductor device according to a first embodiment.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that all similar constituents in all drawings are given similar reference numerals, explanations of which will not always necessarily be repeated.

FIGS. 1A to 4 are sectional views illustrating the individual steps of a method of manufacturing a semiconductor device in a first embodiment. The method of manufacturing a semiconductor device includes a step of forming a plurality of external connection terminals 200 over a semiconductor substrate 100 which has a protective insulating film 120, a plurality of openings 122 formed in the protective insulating film 120, and a plurality of electrode pads 130 respectively exposed out from the plurality of openings 122. More specifically, a plurality of projections 202 respectively given later as cores of the plurality of external connection terminals 200 are formed, by selectively forming a curable resin layer over the protective insulating film 120. Next, flat portions are formed respectively on the top surfaces of the plurality of projections 202, by pressing a molding jig 20 having a flat opposing surface 22 (surface) onto the top surfaces, before the projections 202 are cured. The plurality of projections 202 are then cured. Next, the plurality of external connection terminals 200, and the plurality of interconnects 210 are formed, by selectively forming an electro-conductive film over the plurality of projections 202, the protective insulating film 120, and the plurality of electrode pads 130. The plurality of interconnects 210 respectively connect the plurality of external connection terminals 200 to any of the electrode pads 130. More details will be given below.

First, as illustrated in FIG. 1A, the semiconductor substrate 100 exemplified by a silicon substrate is prepared. The semiconductor substrate 100 herein is in a state of wafer, and has elements such as transistors (not illustrated), a multi-layered interconnect layer 110, the plurality of electrode pads 130, and the protective insulating film 120 are preliminarily formed thereon. The protective insulating film 120 has the openings provided thereto so as to expose therein the plurality of electrode pads 130.

Next, the plurality of projections 202 respectively given later as the cores of the plurality of external connection terminals 200 are formed, by selectively forming a curable resin layer over the protective insulating film 120. The projections 202 are formed typically using a photo-sensitive resin. More specifically, a photo-sensitive resin layer is formed over the protective insulating film 120 and over the electrode pads 130. Next, the resin layer is exposed to light and developed. The plurality of projections 202 are thus formed. In this state, the projections 202 may vary in height, and may have non-flat top surfaces.

In this embodiment, a resin composing the projections 202 may be thermosetting resin, which is exemplified by phenol resin, epoxy resin, polyimide resin, amino resin, unsaturated polyester resin, silicone resin, and allyl resin.

Figure 1B:
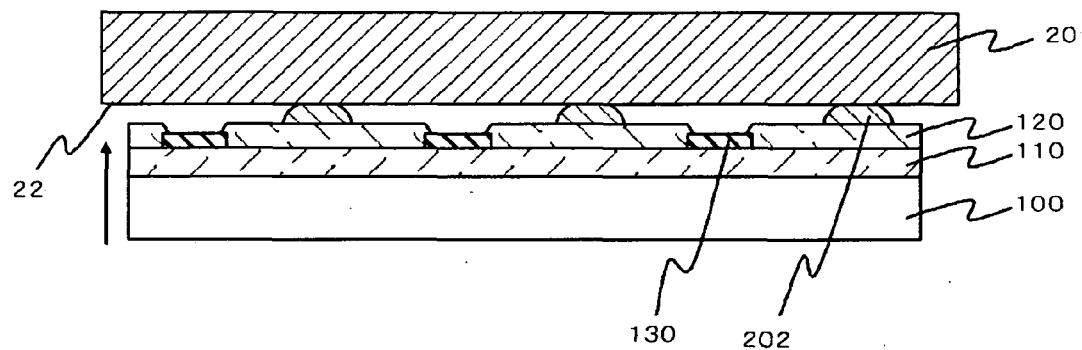
Figure 2A:
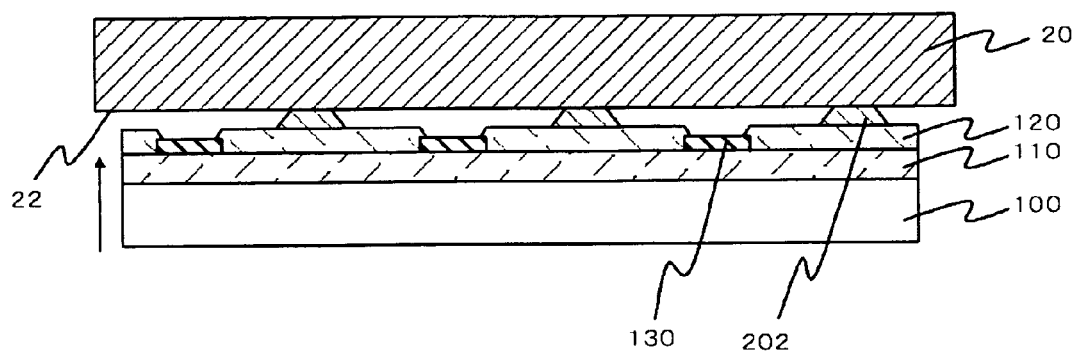

Next, as illustrated in FIG. 1B and FIG. 2A, the molding jig 20 is pressed to the top surfaces of the plurality of projections 202. In this embodiment, the opposing surface 22 of the molding jig 20 is pressed onto the top surfaces of the plurality of projections 202, by moving the semiconductor substrate 100. Note that the molding jig 20 may be pressed onto the top surfaces of the plurality of projections 202, alternatively by moving the molding jig 20. The molding jig 20 is configured to have the flat opposing surface 22, which is aligned in parallel with the semiconductor substrate 100. As a consequence, each of the plurality of projections 202 will have a flat portion formed thereon. These flat portions are aligned in the same level of height.

This process is carried out while keeping the opposing surface 22 of the molding jig 20 pressed onto the top surfaces of the plurality of projections 202 under heating of the projections 202. In this way, the plurality of projections 202 may be cured while being flattened on the top surfaces thereof.

Note that the projections 202 shrink in the process of heat curing, since solvent contained in the resin which composes the projections 202 vaporizes. Since the projections 202 in this embodiment are cured while being pressed by the molding jig 20 on the top surfaces thereof, so that the flatness of the top surfaces of the projections 202 may be maintained even if the projections 202 should shrink. Yet the side faces of the projections 202 shrink.

When the molding jig 20 is pressed to the top surfaces of the plurality of projections 202 as illustrated in FIG. 1B, the side faces of the projections 202 swell outwardly as the top surfaces deform. Accordingly, by appropriately adjusting the force of pressing of the molding jig 20 applied to the top surfaces of the plurality of projections 202, the degree of outward swelling of the side faces is adjustable so that the amount of swelling of the side faces may be cancelled by the amount of shrinkage of the side faces due to curing of the projections 202. In this way, as illustrated in FIG. 2A, the angle of inclination of the side faces may be prevented from locally increasing after the curing.

Figure 2B:
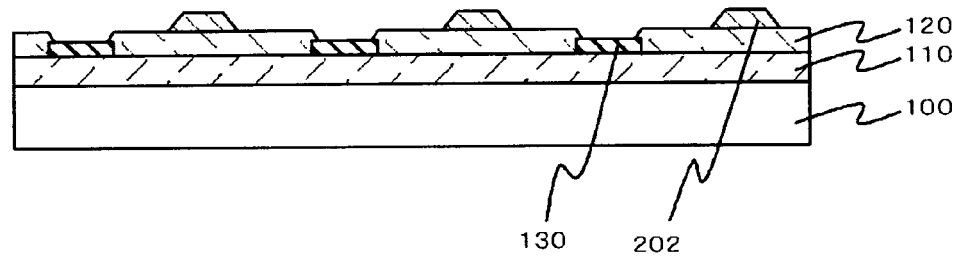

Thereafter, as illustrated in FIG. 2B, the molding jig 20 is brought apart from the top surfaces of the plurality of projections 202.

Figure 3A:
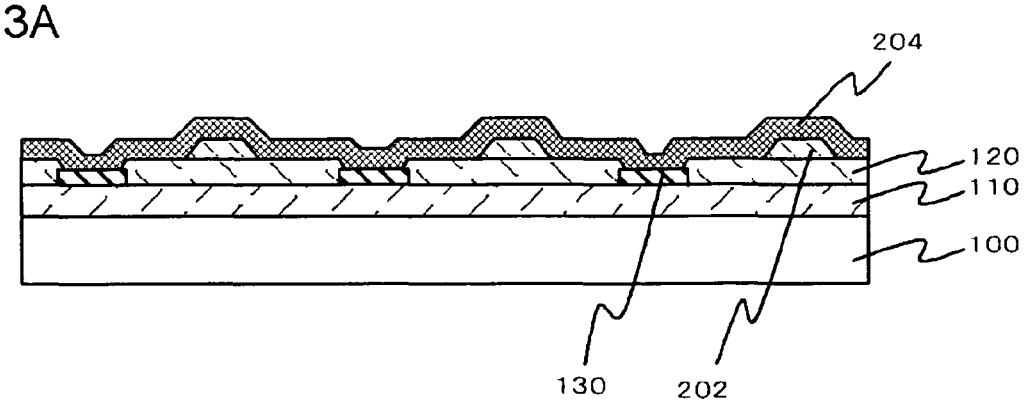

Next, as illustrated in FIG. 3A, an electro-conductive film 204 is formed by a vapor phase process, typically by sputtering, over the plurality of projections 202, the protective insulating film 120, and the plurality of electrode pads 130. In this embodiment, the electro-conductive film 204 is a single-layered film of metal (Au, Cu or Al, for example), or a multi-layered film (a configuration having an underlying electro-conductive film composed of Ti, TiW, Pd or the like, stacked thereon with a layer of Au, Cu, Al or the like, for example). As described in the above, the angle of inclination of the side faces the projections 202 is suppressed from locally increasing after the curing. As a consequence, the electro-conductive film 204 are suppressed from being locally thinned or ruptured at the projections 202.

Figure 3B:
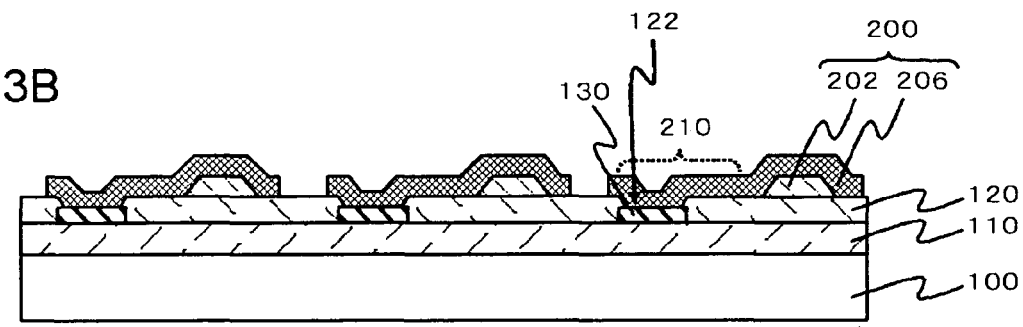

Thereafter, as illustrated in FIG. 3B, the electro-conductive film 204 is selectively removed. This process may be carried out typically by forming a resist pattern (not illustrated) over the electro-conductive film 204, and etching the electro-conductive film 204 while using the resist pattern as a mask. In this way, electro-conductive films 206 which respectively cover the projections 202, and the interconnects 210 are formed respectively in an integrated manner. Each electro-conductive film 206 and each projection 202 configure each external connection terminal 200. Each interconnect 210 connects each electro-conductive film 206 and each electrode pad 130.

The electro-conductive film 204 may alternatively be formed by selectively removing the underlying electro-conductive film, such as a TiW film, to form a pattern, and then by forming a metal layer, such as an Au layer, on the underlying electro-conductive film by electro-less plating.

In this state, the semiconductor device has the protective insulating film 120, the plurality of openings 122, the electrode pads 130', the plurality of external connection terminals 200, and the plurality of interconnects 210. The plurality of electrode pads 130 are positioned at the plurality of openings 122. Each of the plurality of interconnects 210 connects each of the plurality of external connection terminals 200 to either electrode pad 130. Each external connection terminal 200 has the projection 202 composed of a resin, and the electro-conductive film 206 formed over the projection 202 and connected to each interconnect 210. The individual projection 202 of the plurality of external connection terminals 200 have flat top surfaces, aligned in the same level of height.

Figure 4:
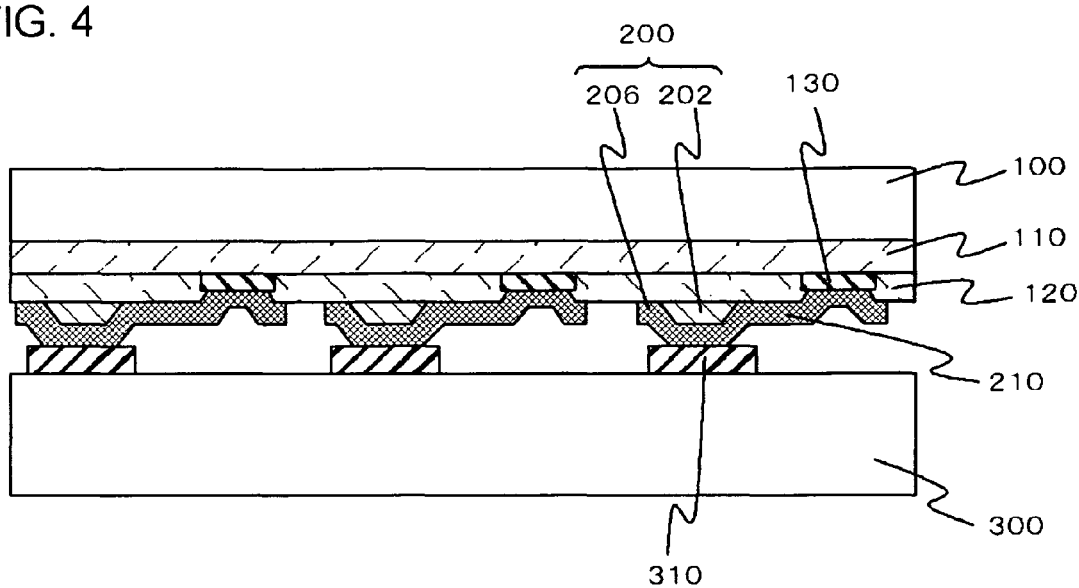

Thereafter, as illustrated in FIG. 4, the semiconductor device illustrated in FIG. 3B is mounted on a mounting substrate 300 by COG (Chip On Glass) bonding or COF (Chip On Film) bonding. For the case where the semiconductor device configures a driver of a liquid crystal cell, the mounting substrate 300 is a glass substrate. In this state, the external connection terminals 200 of the semiconductor device are connected to electrodes 310 of the mounting substrate 300. The electrodes 310 are typically lands, but not limited thereto.

Figure 5:
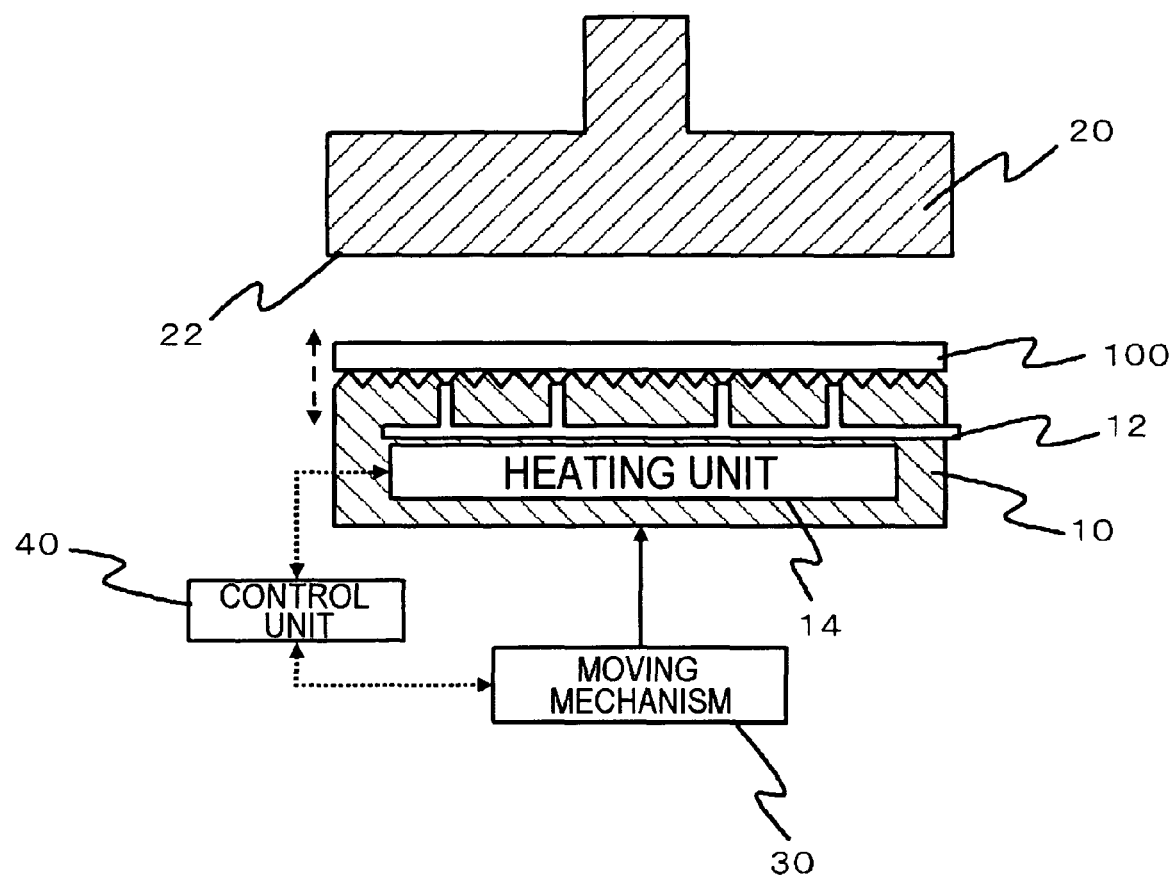
FIG. 5 is a drawing illustrating a configuration of a semiconductor manufacturing apparatus used in the steps illustrated in FIGS. 1B and 2A.

FIG. 5 is a drawing illustrating a configuration of a semiconductor manufacturing apparatus used for the steps illustrated in FIG. 1B and FIG. 2A. The semiconductor manufacturing apparatus has a stage 10, the molding jig 20, and a moving mechanism 30. The stage 10 allows thereon placement of the semiconductor substrate 100. The molding jig 20 is disposed so as to oppose with the stage 10 while placing the semiconductor substrate 100 in between, has the flat opposing surface 22 opposed to the stage 10, and is in parallel with the stage 10. The moving mechanism 30 moves at least either of the stage 10 and the molding jig 20 towards the other. In this embodiment, the moving mechanism 30 moves the stage 10 in the direction of approaching to, and departing from the molding jig 20.

The stage 10 has an chucking mechanism 12 allowing, on the placement surface thereof, chucking of the semiconductor substrate 100, and a heating unit 14 for heating the semiconductor substrate 100. By allowing the semiconductor substrate 100 to be chucked onto the stage 10 using the chucking mechanism 12, the semiconductor substrate 100 may be prevented from warping when the molding jig 20 is pressed onto the projections 202.

The heating unit 14 and the moving mechanism 30 are controlled by a control unit 40. The control unit 40 controls the heating unit to thereby step-wisely elevate or drop temperature of the stage 10 depending on desired ranges of temperature and time. The control unit 40 also makes the moving mechanism 30 control movement of the stage 10, so as to allow the molding jig 20 to be pressed onto, or departed from the projections 202 illustrated in FIG. 1 and so forth, at a desired temperature.

The stage 10 may additionally have a cooling mechanism (not illustrated). In this case, the semiconductor substrate 100 may rapidly be cooled, after the projections 202 are cured.

The molding jig 20 is typically composed of a metal such as stainless steel, and the opposing surface 22 thereof is made larger than the semiconductor substrate 100. The molding jig 20 has the opposing surface 22 given as a single flat surface. Also the molding jig 20 may have a heating mechanism (not illustrated) and a cooling mechanism (not illustrated), similarly to the stage 10. In this case, also the heating mechanism and the cooling mechanism are controlled by the control unit 40.

Next, operations and effects of this embodiment will be explained below. According to this embodiment, the flat portions are formed on the top surfaces of the projections 202, by pressing the molding jig 20 onto the projections 202, before the resin composing the projections 202 is cured, and before the electro-conductive films 206 are formed over the projection 202. Accordingly, the electro-conductive films 206 composing the external connection terminals 200 may be prevented from rupturing, from cracking to thereby elevate the resistivity, and from being degraded in reliability of connection between the external connection terminals and the electrodes of the mounting substrate.

In addition, the top surfaces of the plurality of projections 202 are flattened at the same time, by pressing the opposing surface 22 of the a single molding jig 20. The top surfaces of the plurality of projections 202 may, therefore, be aligned in the same level of height. Accordingly, when the plurality of projections 202 are assumed as a single plane, a high level of flatness of the plane may be ensured. As a consequence, the plurality of external connection terminals 200 may reliably be connected to the electrode 310 of the mounting substrate 300, when the semiconductor device is mounted onto the mounting substrate 300.

By managing the distance between the top surface of the stage 10 and the opposing surface 22 of the molding jig 20, the height of the external connection terminals 200, measured from the back surface of the semiconductor substrate 100, may be managed. Accordingly, when the semiconductor device is mounted onto the mounting substrate 300, the point of time when the external connection terminals 200 come into contact with the electrodes 310 of the mounting substrate 300 may be known, by managing the distance between the back surface of the semiconductor device and the mounting surface of the mounting substrate 300 as a parameter. As a consequence, pressure exerted when the semiconductor device is pressed against the mounting substrate 300 may be minimized.

By appropriately adjusting the force of pressurizing of the molding jig 20 onto the top surfaces of the plurality of projections 202, the degree of outward swelling of the side faces of the projections 202 may be canceled by the amount of shrinkage of the side faces due to curing of the projections 202. In this way, the angle of inclination of the side faces of the projections 202 may be prevented from locally increasing after the curing. The electro-conductive film 204 may, therefore, be suppressed from being locally thinned or ruptured at the projections 202.

Figure 6:
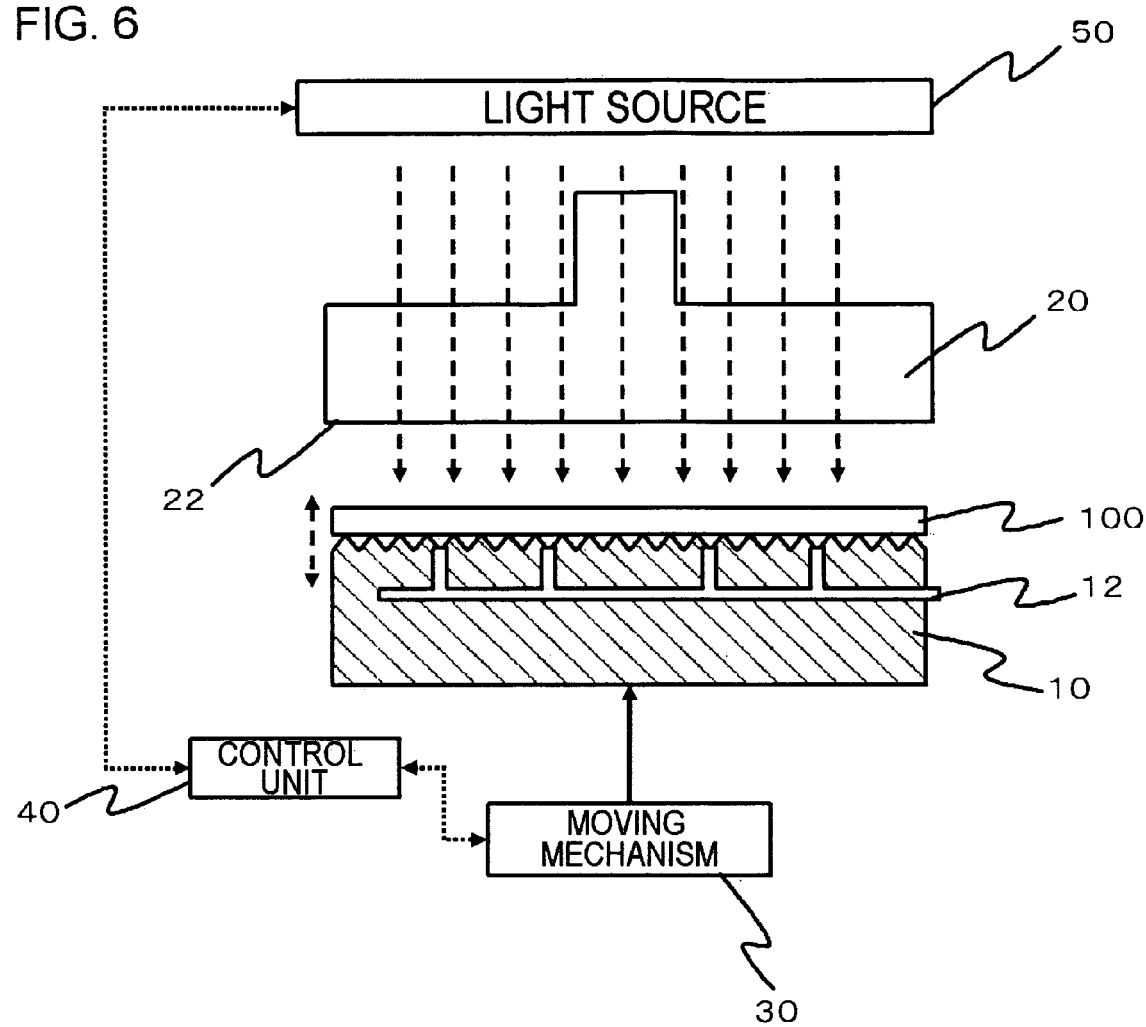
FIG. 6 is a drawing illustrating a configuration of a semiconductor manufacturing apparatus used in a second embodiment.

FIG. 6 is a drawing illustrating a configuration of a semiconductor manufacturing apparatus used for a method of manufacturing a semiconductor device of a second embodiment. In this embodiment, the projections 202 are composed of a photo-curable resin excellent in heat resistance, such as silicone resin or imide resin. The molding jig 20 is composed of a light-transmissive material, such as quartz glass.

The semiconductor manufacturing apparatus of this embodiment has a light source 50 in place of the heating unit 14. The light source 50 is disposed on the side opposite to the stage 10 while placing the molding jig 20 in between. The light source 50 is controlled by the control unit 40.

The method of manufacturing a semiconductor device of this embodiment is similar to the method of manufacturing a semiconductor device explained in the first embodiment, except that the light source 50, in place of the heating unit 14, is allowed to operate after the molding jig 20 is pressed onto the projections 202. By irradiating light through the molding jig 20 to the plurality of projections 202, while pressing the surface of the molding jig 20 onto the top surfaces of the projections 202, the projections 202 may be cured while also being flattened.

Effects similar to those in the first embodiment may be obtained also by this embodiment.

Figure 7A:
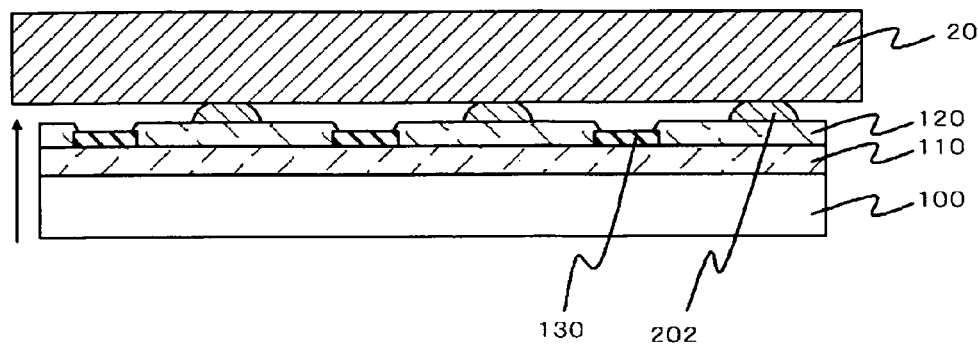
FIGS. 7A to 8 are sectional views illustrating the individual steps of a method of manufacturing a semiconductor device in a third embodiment.
Figure 7B:
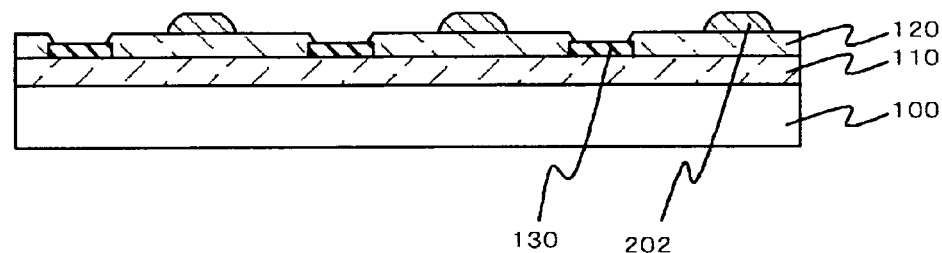
Figure 8:
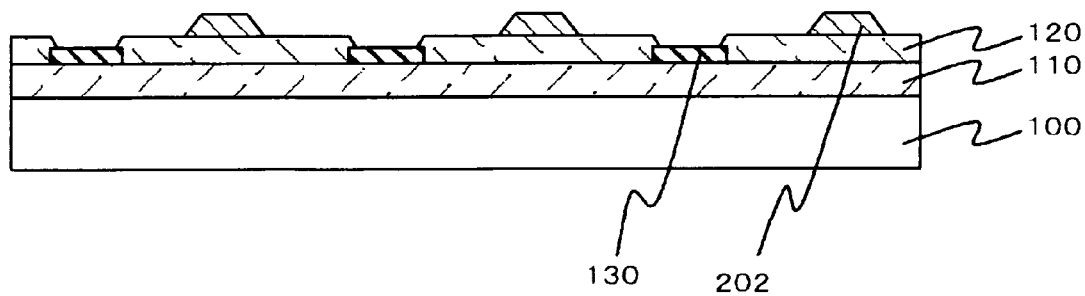

FIGS. 7A and 7B and FIG. 8 are drawings illustrating a method of manufacturing a semiconductor device of a third embodiment. First, as illustrated in FIG. 7A, the projections 202 are formed on the protective insulating film 120, and the molding jig 20 is pressed onto the projections 202. The steps up to now are same as those in the first embodiment.

Next, as illustrated in FIG. 7B, the molding jig 20 is brought away from the projections 202.

Next, as illustrated in FIG. 8, the projections 202 are heated. The projections 202 are cured by the heating.

The heating is then followed by the steps illustrated in FIGS. 3A, 3B and FIG. 4 in the first embodiment. In this way, the semiconductor device is mounted on the mounting substrate 300.

Effects similar to those in the first embodiment may be obtained also by this embodiment. Note that, in the above-described second embodiment, the projections 202 may be cured by irradiating light, after the molding jig 20 is brought apart therefrom, similarly to as in this embodiment.

The embodiments of the present invention have been described referring to the attached drawings merely for exemplary purposes, while allowing adoption of various configurations other than those described in the above.

It is apparent that the present invention is not limited to the above embodiments, but may be modified and changed without departing from the scope and spirit of the invention.

What is claimed is:

1. A method of manufacturing a semiconductor device, the method comprising:
    forming a plurality of external connection terminals over a semiconductor substrate which has a protective insulating film, a plurality of openings formed in said protective insulating film, and a plurality of electrode pads respectively exposed in said plurality of openings,
    said forming a plurality of external connection terminals comprising:
        forming a plurality of projections respectively given later as cores of said plurality of external connection terminals, by selectively forming a curable resin layer over said protective insulating film;
        forming flat portions respectively on the top surfaces of said plurality of projections that are formed over said protective insulating film, by pressing a molding jig having a flat surface onto said top surfaces, before said projections are cured and after said projections are formed by selectively forming the curable resin layer over said protective insulating film;
    curing said plurality of projections; and
    forming said plurality of external connection terminals, and said plurality of interconnects which respectively connect said plurality of external connection terminals to said electrode pads, by selectively forming an electroconductive film over said plurality of projections, said protective insulating film, and said plurality of electrode pads after forming the flat portions on the top surfaces of said plurality of projections formed over said protective insulating film.

2. The method of manufacturing a semiconductor device as claimed in claim 1,
    wherein said curing said projections is carried out while keeping said molding jig pressed onto the top surfaces of said plurality of projections.

3. The method of manufacturing a semiconductor device as claimed in claim 2,
    wherein said resin layer is composed of a thermosetting resin, and
    said curing said projections is carried out while keeping the molding jig pressed onto the top surfaces of said plurality of projections under heating of said projections.

4. The method of manufacturing a semiconductor device as claimed in claim 1,
    wherein said curing said projections is carried out while keeping said molding jig away from said plurality of projections, although said molding jig once being pressed onto the top surfaces thereof in advance.

5. The method of manufacturing a semiconductor device as claimed in claim 4,
    wherein said resin layer is composed of a thermosetting resin, and
    said curing said projections is carried out while keeping said molding jig away from said plurality of projections under heating of said projections, although said molding jig once being pressed onto the top surfaces thereof in advance.

6. The method of manufacturing a semiconductor device as claimed in claim 4,
    wherein said resin layer is composed of a photo-curable resin, and
    said curing said projections is carried out while keeping said molding jig away from said plurality of projections under irradiation of light to said projections, although said molding jig once being pressed onto the top surfaces thereof in advance.

7. The method of manufacturing a semiconductor device as claimed in claim 3,
    wherein said thermosetting resin is phenol resin, epoxy resin, polyimide resin, amino resin, unsaturated polyester resin, silicone resin, or allyl resin.

8. The method of manufacturing a semiconductor device as claimed in claim 2,
    wherein said resin layer is composed of a photo-curable resin, and said molding jig is composed of a light-transmissive material, and
    said curing said projections is carried out while keeping the surface of said molding jig pressed to the top surfaces of said plurality of projections, under irradiation of light to said projections through said molding jig.

9. The method of manufacturing a semiconductor device as claimed in claim 6,
    wherein said photo-curable resin is silicone resin or imide resin.

10. The method of manufacturing a semiconductor device as claimed in claim 1, wherein said forming said plurality of external connection terminals and said plurality of interconnects further comprising:
    forming said electro-conductive film by a vapor-phase process over said plurality of projections, said protective insulating film, and said plurality of electrode pads; and
    selectively removing said electro-conductive film.

11. A method of manufacturing a semiconductor device, comprising:
    forming a plurality of projections respectively given later as cores of a plurality of external connection terminals, by selectively forming a curable resin layer over a protective insulating film;
    forming flat portions respectively on the top surfaces of said plurality of projections that are formed over said protective insulating film, by pressing a molding unit having a flat surface onto said top surfaces, before said projections are cured and after said projections are formed by selectively forming the curable resign layer over said protective insulating film;
    curing said plurality of projections; and
    forming said plurality of external connection terminals, and plurality of interconnects which respectively connect said plurality of external connection terminals to electrode pads, by selectively forming an electro-conductive film over said plurality of projections, said protective insulating film, and said plurality of electrode pads after forming the flat portions on the top surfaces of said plurality of projections formed over said protective insulating film.

12. The method of manufacturing a semiconductor device as claimed in claim 11, wherein said curing said projections is carried out while keeping said molding unit pressed onto the top surfaces of said plurality of projections.

13. The method of manufacturing a semiconductor device as claimed in claim 12,
    wherein said resin layer is composed of a thermosetting resin, and
    said curing said projections is carried out while keeping the molding unit pressed onto the top surfaces of said plurality of projections under heating of said projections.

14. The method of manufacturing a semiconductor device as claimed in claim 11,
    wherein said curing said projections is carried out while keeping said molding unit away from said plurality of projections, although said molding unit once being pressed onto the top surfaces thereof in advance.

15. The method of manufacturing a semiconductor device as claimed in claim 14,
    wherein said resin layer is composed of a thermosetting resin, and
    said curing said projections is carried out while keeping said molding unit away from said plurality of projections under heating of said projections, although said molding unit once being pressed onto the top surfaces thereof in advance.

16. The method of manufacturing a semiconductor device as claimed in claim 11,
    wherein said forming said plurality of external connection terminals and said plurality of interconnects further comprising:
    forming said electro-conductive film by a vapor-phase process over said plurality of projections, said protective insulating film, and said plurality of electrode pads; and
    selectively removing said electro-conductive film.

* * * * *